REMOTE CONTROL SYSTEM

Filed May 18, 1967

INVENTOR
Leopold A. Harwood
BY Eugene M. Whitacre
ATTORNEY

Jan. 21, 1969 L. A. HARWOOD 3,423,725

REMOTE CONTROL SYSTEM

Filed May 18, 1967 Sheet 2 of 2

INVENTOR
Leopold A. Harwood

BY Eugene M. Whitacre

ATTORNEY

United States Patent Office 3,423,725
Patented Jan. 21, 1969

3,423,725

REMOTE CONTROL SYSTEM

Leopold A. Harwood, Somerville, N.J., assignor to Radio Corporation of America, a corporation of Delaware Filed May 18, 1967, Ser. No. 639,321
U.S. Cl. 340—15 7 Claims
Int. Cl. H04b *11/00*

ABSTRACT OF THE DISCLOSURE

An amplifier for a remote control receiver which provides high sensitivity to desired signals and substantial immunity to spurious signals, and which is especially suited for fabrication using integrated circuit techniques, includes asymmetrical limiters driving a control stage for a ringing circuit tuned to a frequency substantially higher than that of received input signals which key the control stage to excite the ringing circuit and produce output pulses at a repetition rate equal to an integral multiple, including one, of the input signal frequency.

This invention relates to electrical signal translating systems which provide a relatively constant output signal level for wide variations in input signal level, and which is highly discriminatory of all undesired input signals. Electrical signal translating systems of this type are especially suitable for remote control receiver applications.

An electrical signal translating system suitable for remote control application and embodying the invention includes a control stage for an energy storage circuit. In an embodiment of the invention hereinafter described, the energy storage circuit comprises a ringing circuit tuned to a frequency substantially higher than the frequency of an input signal applied to the system. Output signals from the ringing circuit comprise substantially constant amplitude bursts or pulses of energy occuring at a repetition rate equal to an integral multiple, including one, of the input signal frequency. The output signals are coupled to suitable frequency detectors which control predetermined function circuits in the receiver, as is known in the art.

In accordance with a feature of the invention, the signal channel for conveying the input signals to the control stage includes asymmetrical limiters. The signal channel provides actuating pulses to the control stage which have a duration which is of the order of the period of a wave produced by the ringing circuit. As will be explained hereinafter, the output signal level from the control stage and ringing circuit is of substantially constant amplitude even for wide variations in the input signal level. In addition, the system provides effective discrimination against all but desired input signals.

The novel features which are considered to be characteristic of this invention are set forth with particularity in the appended claims. The invention itself, however, both as to its organization and method of operation as well as to objects and advantages thereof, will best be understood from the following description when read in connection with the accompanying drawings in which:

Figures 1, 3, 4:
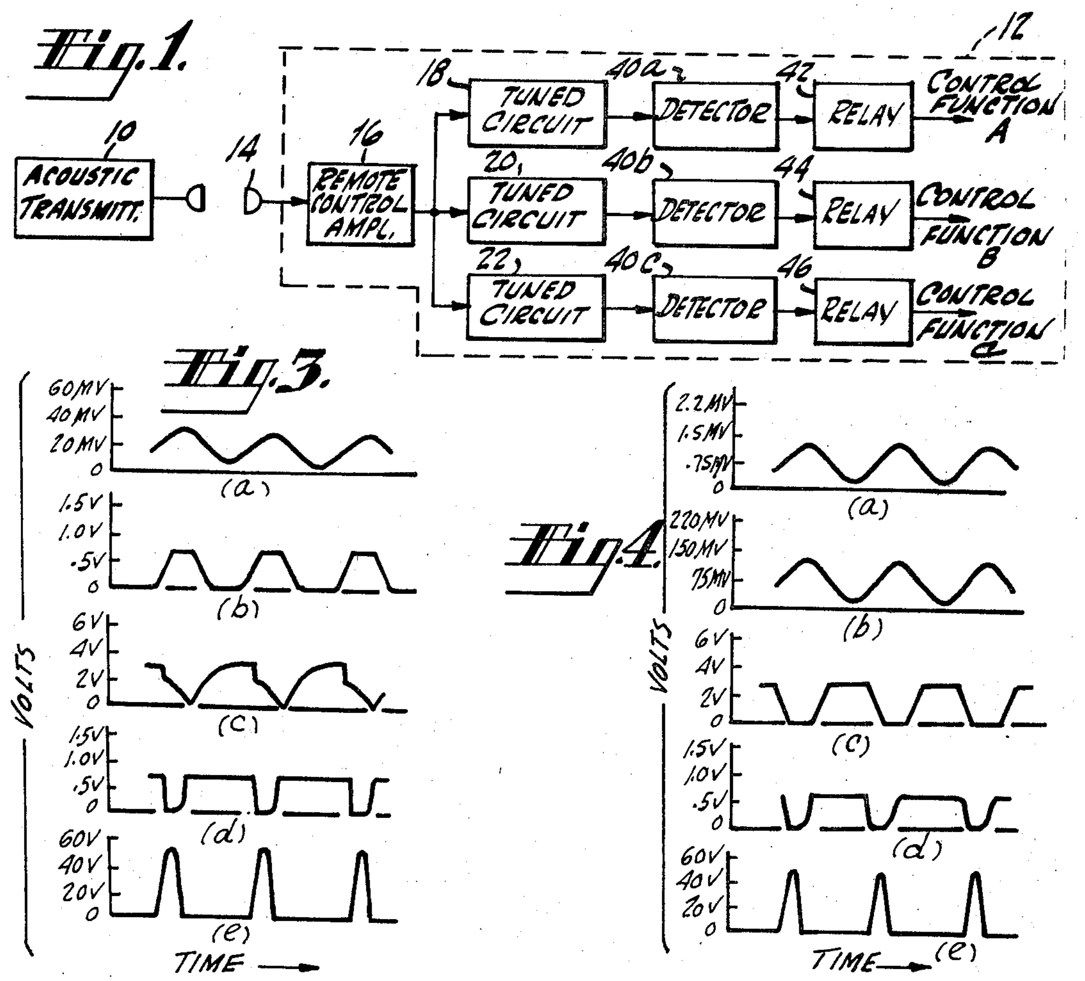
FIGURE 1 is a block diagram of a typical remote control system known in the prior art.
FIGURES 3–6 are signal waveforms helpful in an understanding of the invention.

The remote control system of FIGURE 1 includes a portable transmitter 10 of the type which generates acoustic waves. These waves are generated at discrete frequencies corresponding in number to the number of functions to be controlled at the receiver 12. One of these waves, selected by means of individual push-button switches at the transmitter 10, is detected in the receiver 12 by a condenser microphone 14 and the resulting electrical signal produced is coupled to a remote control amplifier 16. After amplification, this signal is applied to a plurality of tuned circuits 18, 20, 22, etc., also equal in number to the desired functions, each of which is tuned to a particular one of the generated signal frequencies. Selective filtering of the signal in one of the circuits 18, 20, 22, etc., is followed by further amplification and rectification in individual detector units **40*a*, 40*b*, 40*c*, etc., and the rectified direct current component activates the one of relays 42, 44, 46, etc., which corresponds to the chosen function. These relays, when energized, adjust the various circuits of the receiver 12** to produce the desired function change.

A remote control system of this type providing three, seven, or eight control functions is shown in Remote Television Service Data; File 1966, No. T21/T22, published by RCA Sales Corporation, 600 North Sherman Drive, Indianapolis, Ind. 46201.

Figure 2:
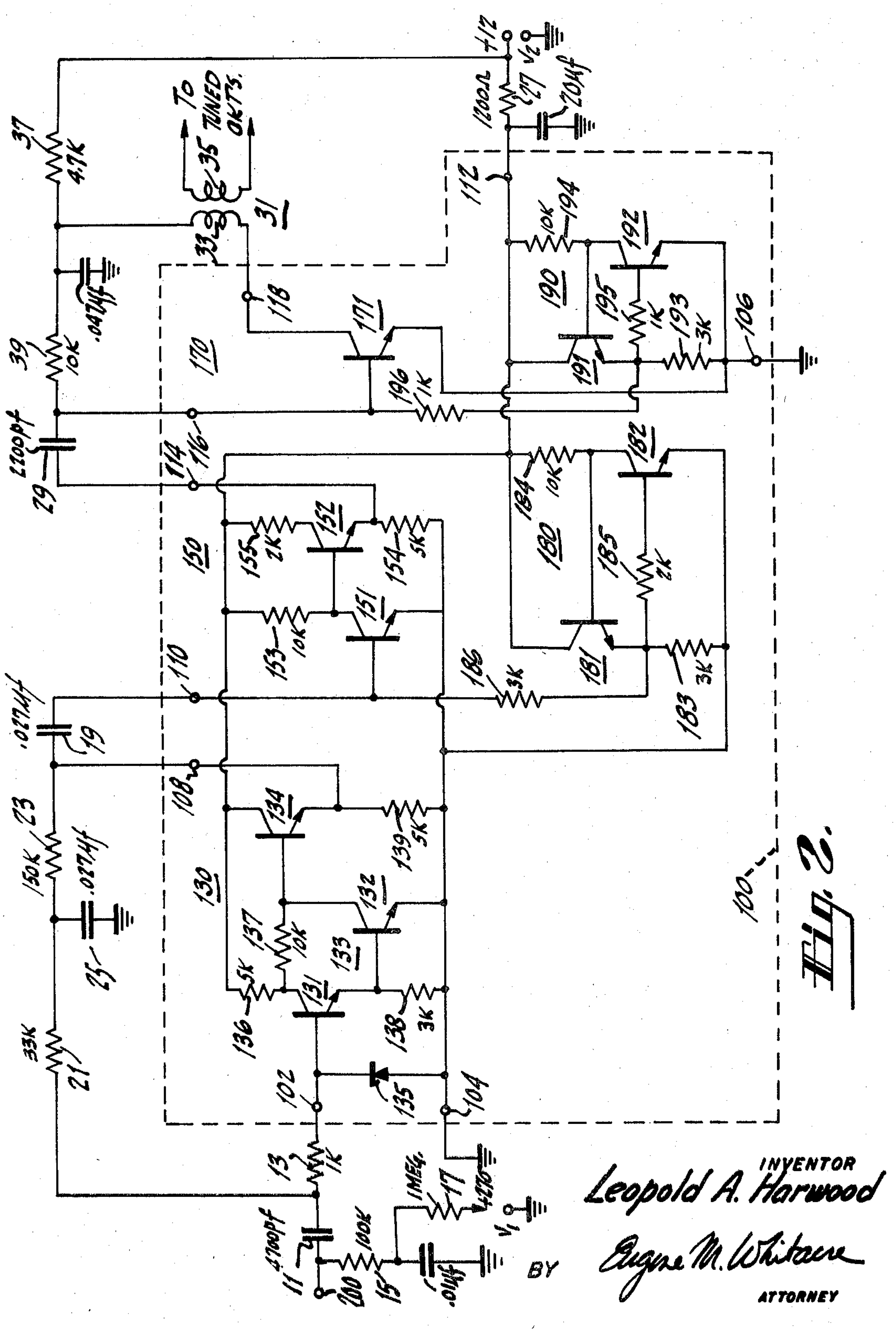
FIGURE 2 is a schematic circuit diagram of an amplifier embodying the present invention and useful in the remote control system of FIGURE 1.

The schematic circuit diagram of FIGURE 2 shows a remote control integrated circuit amplifier which may be used in the remote control system referenced above. The dashed rectangle 100 illustrates a monolithic semiconductor integrated circuit chip. The chip has a plurality of contact areas around its periphery, through which connections to the integrated circuit may be made. For example, the chip 100 has a pair of input contact areas 102 and 104 for coupling to an electrostatic microphone pickup of the remote control system (not shown). The contact areas 104 and 106 provide a pair of common, or ground, potential contact areas which are connected with the various circuit ground connections shown on the chip. As to physical dimensions, the chip 100 may be of the order of 55 mils x 55 mils.

A series circuit including capacitor 11 and resistor 13 couples the output signal from the microphone pickup (terminal 200) to the input contact areas 102 and 104 of the integrated circuit chip 100. A direct voltage supply $V_1$ polarizes the microphone through a pair of resistors 15 and 17 and through the terminal 200.

The amplifier arrangement on the chip 100 is a three stage unit 130, 150, 170. In the input stage 130, the first two transistors 131 and 132 form a Darlington pair 133, with an input impedance sufficiently high to avoid excessive loading of the microphone. The third transistor 134 is connected as an emitter follower and furnishes an amplified signal to the second stage 150 by means of an external coupling capacitor 19 connected between the contact areas 108 and 110. An external feedback network, formed by resistors 21 and 23 and capacitor 25, is provided to maintain transistors 131, 132 and 134 properly biased. This network, connected between the contact area 108 and the junction of capacitor 11 and resistor 13, also establishes a high-pass characteristic for the input stage 130 so as to maintain a substantially constant gain at the frequencies generated by the remote control transmitter. A diode 135 is included in the stage 130 to prevent damage to the circuit on the chip 100 caused by an accidental voltage discharge from the coupling capacitor 11 (charged by the supply $V_1$ through the resistors 15 and 17). It will also be noted in this respect that the resistor 13 effectively limits the amount of capacitive discharge current. Operating potential for the stage 130 is provided by a direct voltage supply $V_2$, which couples to the chip 100 through a resistor 27 and a contact area 112.

The resistors 136–139 included within the amplifier stage 130 are chosen so as to provide a low noise figure for the stage. That is, these resistors are chosen sufficiently large to limit the collector currents of the transistors 131, 132 and 134 to a value conforming to a low noise figure, but not so large that the decrease in transistor betas which results degrades the noise figure. The resistance value in the collector electrode circuit of the transistor 132 is further chosen to provide with the effective capacitance to ground from that electrode, a high frequency performance such that the stage 130 exhibits its maximum voltage gain over a range of frequencies corresponding to that generated by the remote control transmitter. With the component values shown in FIGURE 2, the amplifier stage 130 provides approximately 40 db of gain within the 35–45 kHz. range of signal frequencies generated by the transmitter.

The second stage 150 includes a first transistor 151 connected in a grounded emitter configuration and a second transistor 152 connected as an emitter follower. This stage 150 provides a voltage gain primarily determined by the value of a resistor 153 connected in the collector electrode circuit of the transistor 151, and a frequency response determined by the product of that resistance value and the capacitance to ground measured from that electrode. With the component values shown, this gain is also about 40 db and is constant within the 35–45 kHz. range. Input signals are coupled to the stage 150 from the contact area 110, while the output signals are fed from the emitter follower circuit to the third stage 170 by means of a coupling capacitor 29 externally connected between the contact areas 114 and 116. The current flowing in the collector electrode circuit of the transistor 151 is regulated by an internal bias supply 180, while the current flowing in the transistor 152 is controlled by a resistor 154 connected in its emitter electrode circuit.

The internal bias supply 180 is of the type disclosed and claimed in my pending application Ser. No. 510,212, filed Nov. 29, 1965 and entitled "Electrical Circuits." As is therein described, the supply is essentially an amplifier stage with negative feedback to provide a stabilized, fixed reference voltage at a low impedance output. More particularly, as formed by transistors 181 and 182 and by resistors 183, 184 and 185 in FIGURE 2, the bias supply develops a direct current voltage equal to the $V_{be}$ base-to-emitter voltage drop of the transistor 182 at an output impedance of approximately 50 ohms. This direct voltage, furthermore, developed at the base electrode of the transistor 182, is maintained substantially constant, even for wide variations in the energizing potential applied at the contact area 112. It will be understood in this respect, that the $V_{be}$ voltage drop of the transistor 182 in the integrated circuit chip 100 equals that of the transistor 181, and for monolithic silicon is of the order of 0.7 volt.

An isolation resistor 186 is included on the integrated chip 100 to couple the bias supply 180 to the second amplifier stage 150. This resistor 186 is connected between the emitter electrode of the transistor 181 and the base electrode of the transistor 151, and is selected with respect to the bias supply feedback resistor 185 such that the voltage drops produced across each are substantially equal. Stated another way, the resistor 186 is selected such that the collector current of the transistor 151 in the stage 150 equals that of the transistor 182 in the supply 180. With equal valued resistors 153 and 184 in the collector electrode circuits of these transistors 151 and 182, the resistor 186 is chosen slightly larger than the resistor 185 to allow for the effects of possible transistor mismatch and leakage current.

The third amplifier stage 170 includes a grounded emitter control transistor 171, to whose base electrode are coupled the output signals developed by the amplifier stage 150. The transistor 170 is biased by an internal supply 190 of similar construction to the bias supply 180, but with its respective isolation and feedback resistors 196 and 195 being of equal value. A separate ground terminal is provided for the amplifier stage 170 at the contact area 106, to prevent any common impedance coupling to the stages 130 and 150 that may otherwise occur. The use of separate bias supplies 180 and 190 for the amplifier stages 150 and 170 also serves to isolate those stages and prevent signal feedback through a common coupling supply lead metalization. A voltage gain of 40 db is also provided by this stage 170.

The collector electrode of the transistor 171 is terminated in an output transformer 31, the primary winding 33 of which resonates with the collector capacitance and its stray capacitance at a frequency of approximately 180 kHz. As shown, the winding 33 is coupled between the output contact area 118 of the chip 100 and a resistor 37 which connects to the potential supply $V_2$. The secondary winding 35 of the transformer 31 drives the tuned circuits of the remote control receiver (not shown), to provide the desired control functions. An additional feedback resistor 39 couples the transformer primary winding 33 to the input circuit of the amplifier stage 171 by way of the contact area 116.

The manner of implementing the various transistors, diodes and resistors on the integrated circuit chip 100 is known in the art. Because the voltage gain from the input terminal 102 of the amplifier to the output terminal 118 is of the order of 120 db, and because of the very small chip size, the physical layout of these integrated circuit components is quite important. In one constructed version, the input and output terminals 102 and 118 were located at opposite ends of the integrated chip. The individual stages were additionally placed in such manner that the stage 170 was separated from the stage 150 by a reverse biased isolation junction, while the stage 150 was separated from the stage 130 by another such junction. The relatively large output signal developed at the terminal 118 was thus prevented from reaching the input terminal 102 by these multiple reverse biased regions. The geometry of the transistors 131 and 132 in this version was chosen larger than that of the remaining transistors so as to provide improved low noise performance in the stage 130 at relatively low frequencies.

As was previously mentioned, one feature of the amplifier circuit shown in FIGURE 2 is its ability to operate over a wide range of input signal levels. With the component values shown in the drawing, the gain exhibited is approximately 40 db per stage, or 120 db overall, and is more than adequate to provide an output signal of sufficient amplitude to drive the detector circuits and relays normally used in remote control receiver applications. The equivalent noise voltage generated within the amplifier is of the order of 1 microvolt and the smallest detectable signal is approximately 20 microvolts.

As was also mentioned, the amplifier of FIGURE 2 is substantially immune to spurious signals. Random signals—such as are produced by the clinking of coins, jangling of keys, and ringing of telephones—simultaneously contain several harmonically unrelated frequency components, some of which fall within the passband of the tuned circuits coupled to the detector of the remote control receiver. If these individual frequencies are preserved, such as they would be if processed in a linear amplifier, they could then erroneously activate the control relays and produce an undesired function change. This is prevented from happening in the amplifier of FIGURE 2, however, by using a nonlinear processing of the input signals, as by limiting. The signal frequencies that are then produced at the amplifier output are unrelated to those at the amplifier input, to the extent that they can be easily rejected by the following tuned circuits.

To be more specific, consider first the following quiescent voltages. With respect to the amplifier stage 130, it will be noted that the quiescent voltage at the base electrode of transistor 132 is approximately one $V_{be}$ drop or 0.7 volt above ground. The voltage at the base electrode of transistor 131 is then one $V_{be}$ drop greater, or 1.4 volts, while that at the emitter electrode of transistor 134 is 1.4 volts plus the voltage drop across resistors 13, 21 and 23. The quiescent voltage at the base electrode of transistor 134 is one $V_{be}$ greater than at its emitter electrode, or 2.1 volts plus the drop across the three named resistors. The amplifier stage 130 will thus asymmetrically limit on large input signals applied to the base electrode of transistor 131, in that the collector electrode of transistor 132 will swing more positive towards the 12 volt $V_2$ supply voltage from an approximately 2.1 volt level (when transistor 131 becomes cut-off) than it will swing negative toward ground (when transistor 131 becomes saturated).

With respect to the amplifier stage 150, it will be noted that the quiescent voltage at the base electrode of transistor 182 in the bias potential supply 180 is approximately one $V_{be}$ voltage drop or 0.7 volt above ground, while that at the emitter electrode of transistor 181 is that 0.7 volt plus the drop across the resistor 185. The voltage at the base electrode of transistor 181 is one $V_{be}$ greater than at its emitter electrode, or 1.4 volts plus the resistor 185 voltage drop. Since resistors 185 and 186 were selected so that the voltage drops across each would be substantially equal, and since the value of resistor 153 in the stage 150 was chosen to equal that of resistor 184 in the supply 180, it will be seen that the arrangement in FIGURE 2 is such that the quiescent voltage at the junction of the resistors 185 and 186 effectively drives two circuits in parallel, one including the transistor 151 and the other including the transistor 182. With the transistors 151 and 182 essentially identical in the integrated circuit construction of the drawing, it will be noted that substantially equal currents flow in their respective collector electrode circuits. The quiescent voltage developed at the collector electrode of the transistor 151 thus equals that at the collector electrode of the transistor 182, or approximately 1.4 volts, the voltage drop across resistor 185 being small compared to this value. The amplifier stage 150 will also limit asymmetrically, therefore, since the collector electrode of the transistor 151 will swing more in the positive direction from its quiescent value (towards the 12 volt $V_2$ supply) than it will swing in the negative direction (towards ground).

With respect to the amplifier or control stage 170 it will be understood that the parameters of the stage are so chosen that transistor 171 will be very heavily conducting. With the component values shown in the drawing, the collector electrode of the transistor 171 will then be at a quiescent voltage close to ground potential. The amplifier stage 170 will also operate as an asymmetrical limiter, then, since the positive excursions from the quiescent value at the collector electrode of the transistor 171 (towards the 12 volt supply $V_2$) will far exceed the negative excursions from that same level (towards ground).

It will be appreciated that in all three amplifier stages 130, 150 and 170, temperature changes only affect the level at which limiting occurs. The fact that limiting will take place with proper signal levels, however, remains unchanged. It will also be appreciated that the quiescent current flowing through the primary winding 33 of the transformer 31 is mainly dependent on the value of the resistor 37, and will be substantially constant and independent of variations in transistor parameters. It should further be noted that the level of limiting for each amplifier stage 130, 150 and 170 is determined by the biasing circuits 180 and 190 which are substantially independent of variations in the potential supply $V_2$.

Consider now the operation of the amplifier shown in FIGURE 2. Let it be assumed that only desired control signals are supplied to the input terminal 200 of the configuration. Assume further that these signals have an amplitude sufficient to drive the amplifier stage 130 into a limiting condition (for example, 25 millivolts). Such signals may appear as illustrated by waveform A in FIGURE 3. The output signals developed by the stage 130 in response may take the waveform illustrated in B of FIGURE 3, with these signals being developed at the contact area 108 on the integrated chip 100. When coupled to the stage 150 through the external capacitor 19, these signals also drive that amplifier stage into a limiting condition. In response, the output signals developed by the stage 150 at the contact area 114 appear as shown in waveform C of FIGURE 3. The external capacitor 29 couples these signals to the input base electrode of the third amplifier stage 170, modifying them to appear as in FIGURE 3, waveform D. It will be apparent that by overdriving the first two amplifier stages 130 and 150, the sinusoidal input signals are converted to negative going pulse signals whose durations are small compared to the period of the input signals.

Upon application of the negative going pulse signals to the base electrode of the transistor 171, that transistor is rendered non-conductive. The magnetic energy stored in the primary winding 33 of the transformer 31 is released and the collector circuit of the transformer 171 rings at its natural resonant frequency, about 180 kHz. The duration of the negative pulse applied to the transistor 171 corresponds, as shown, to approximately the period of one cycle of this 180 kHz. signal. The negative half cycle of the ringing pulse, however, is clipped by the base-collector junction of the transistor 171, which becomes forward biased at this time. The output signal developed by the amplifier stage 170 (at the contact area 118) has the waveform illustrated in E of FIGURE 3. It will be noted that this signal comprises the positive portion of the 180 kHz. ringing pulse, and has a repetition rate equal to that of the 35–45 kHz. frequency input signals supplied to terminal 200 of the amplifier configuration. This positive signal is coupled via the secondary winding 35 of the transformer 31 to the tuned circuits of the remote control receiver, wherein the fundamental frequency component is recovered and the harmonics are rejected by a filtering process. The amplitude of this fundamental frequency component is a function of the quiescent current flowing in the winding 33, and is sufficient to activate the function control relays when coupled to the remainder of the receiver circuits.

(It will be appreciated that the ringing time of the resonant output circuit is restricted by the duration of the negative pulse signal applied to transistor 171, and that the number of clipped sinewave pulses thus appearing in each cycle of the applied signal can be controlled by varying the negative pulse duration. One clipped sinewave pulse per cycle is produced in the arrangement of FIGURE 2 so that the repetition rate of those pulses is equal to that of the desired input signals. In general, however, the repetition rate will be that multiple of the input signal frequency which equals the number of clipped sinewave pulses developed during each input signal period.)

Assume now that the amplitude of the signals applied to input terminal 200 is insufficient to drive the amplifier stage 130 to limiting, but when amplified is sufficient to drive the stage 150 to a limiting condition. Such signals may appear as shown in waveform A of FIGURE 4, where for purposes of illustration, they are depicted as being 1 millivolt in amplitude. The output signals developed by the stage 130 in response is of the same general waveform, as shown in B of FIGURE 4. These output signals, when coupled to the stage 150 through the external capacitor 19, produce the limiting signal waveform C at the contact area 114 of the integrated chip 100 and, also, the waveform D at the base electrode of the third stage transistor 171. The output signal developed by the amplifier stage 170 at the contact area 118 has the waveshape shown in E of FIGURE 4, where it will once against be noted that it comprises a single positive going pulse coming at a repetition rate corresponding to that of the input signal applied to the terminal 200. The remainder of the remote control circuits co-act, as before, to develop from this output sig nal, the fundamental frequency component associated with the control function to be performed.

Figures 5, 6:
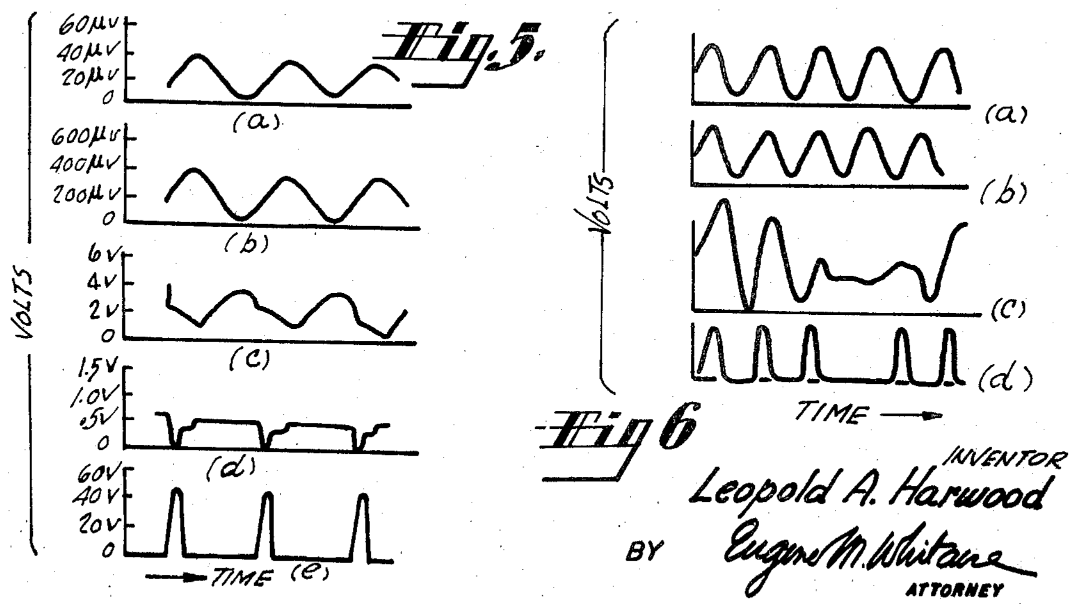

In a similar manner, the waveforms A–E in FIGURE 5 represent the signals developed in the remote control amplifier of FIGURE 2 where the input signals to terminal 200 are of insufficient amplitude to cause limiting either in the first or second amplifier stages 130 or 150. It will be understood, however, that the input signal is above the minimum detectable level (approximately 20 microvolts), so that the overall voltage gain provided by the amplifier is sufficient to cause limiting in the third amplifier stage 170. The signal represented by the waveform E in FIGURE 5 is again operated upon by the remote control receiver circuits to recreate the fundamental frequency control signal associated with the function to be performed.

It will be apparent from the foregoing description that the output signal developed by the amplifier stage 170 has an amplitude which is independent of the level of the control signal applied to the input terminal 200. That is, for all input signal levels above the minimum detectable value, the transistor 171 will become cut off and the output signal amplitude will be determined solely by the magnetic energy stored in the winding 33, i.e., by the value of the quiescent current flowing through the primary winding 33 of the transformer 31. This amplitude will remain substantially constant as it is set by the resistor 37, and not by the specific input signal magnitude. It will similarly be apparent that changes in the input signal waveform will also have no effect on the output signal amplitude. Variations in the operating temperature of the receiver, furthermore, will produce negligible effect on the output swing. It will thus be appreciated that the operation of the amplifier of the invention will be maintained as described over a wide temperature range.

Consider further the operation of the amplifier shown in FIGURE 2 in the presence of undesired spurious signals, such as are produced by ringing telephones, clinking coins, etc. These signals, in general, simultaneously contain several harmonically unrelated frequency components. Some components, furthermore, may be of a frequency within the passband of the tuned circuits of the remote control receiver, i.e., between 35 and 45 kHz. Two of these components may be represented as shown in waveforms A and B or FIGURE 6, wherein waveform C represents the resultant of the two. This waveform C may be considered to represent a signal applied to the input terminal 200 of the integrated circuit chip 100 of FIGURE 2 which, if linearly preserved within the amplifier, would erroneously actuate the function control relays of the receiver. By virtue of the limiting feature provided by the third amplifier stage 170, however, the output signal produced by that stage (FIGURE 6, waveform D) consists of positive going sinewave pulses which appear at a rate unrelated to the frequency of either of the amplifier input signals. The fundamental frequency of the output signal is essentially equal to the beat frequency between the two input signals, and is easily rejected by the selective tuned circuit filters. The harmonics that are produced, in addition, are sufficiently reduced in amplitude to fall below the level at which the control relays will operate. The ensuing result is that the function relays are thus protected against false actuation and the remote control receiver circuits will only respond to desired signals emanating from the local transmitter.

Consider now the operation of the amplifier with only random noise present, i.e., in the absence of any input signal. As was previously mentioned, the noise voltage generated within the amplifier is of the order of 1 microvolt. This noise appears as a spectrum of low energy pulses centered about the 180 kHz. resonant frequency of the output circuit of the amplifier. Rectification of these pulses in the detector circuit produces a noise current of less than 0.5 ma., which is less than either the 7.5 ma. pull-in or 1.5 ma. drop-out current characteristics exhibited by typical remote control relay units. The relays, therefore, whose contacts normally close when the rectified current reaches the pull-in level and remain closed until the current falls below the drop-out level, are insensitive to any noise generated within the amplifier itself.

Input signals having an amplitude below the 20 microvolts minimum detectable level modulate this random noise to produce an output in the form of noise bursts appearing at a rate corresponding to the frequency of the applied signals. The fundamental frequency component is recovered by the subsequent filtering provided by the tuned circuits of the system but is once again of insufficient magnitude to actuate the function control relays.

A feature of the amplifier arrangement of FIGURE 2 is that a remote controlled receiver which includes it will be substantially immune to adjacent channel control signals. Consider, for example, a receiver having eight high Q, tuned filter circuits spaced at 1.5 kHz. intervals to control the same number of functions for a 35–45 kHz. transmitting range frequency. Since the response 1.5 kHz. of resonance for practical Q circuits is approximately 12 db down, it will be seen that amplitude variations in an input control signal at one frequency and associated with a particular relay which are greater than 12 db may be sufficient to actuate an adjacent relay as well. However, since the output pulse signal developed by the amplifier of FIGURE 2 remains substantially constant in amplitude and independent of input signal variations, it will be appreciated that such changes have no effect on any relay but the one with which it is associated.

I claim:

1. A signal translating arrangement for use in conjunction with a remote control system of the type wherein acoustic waves generated by a local transmitter are detected by a microphone pickup device and converted to electrical signals which are subsequently selectively filtered by a plurality of tuned circuits to develop function control signals for said system, comprising:

a junction transistor device having base, emitter and collector electrodes;

a signal input circuit coupled between said base and emitter electrodes;

a ringing circuit including an inductive element tuned to a frequency substantially higher than that of desired signals applied to said input circuit, said inductive element being coupled between said collector and emitter electrodes;

biasing means connected to said base, emitter and collector electrodes to establish an operating point for said transistor such that said transistor responds to applied input signals to excite said ringing circuit and to cause the base-to-collector junction of said transistor to become forward biased by alternate half cycles of the resultant ringing wave;

and means for coupling said resultant ringing wave to said plurality of tuned circuits to be selectively filtered thereby; and wherein said signal input circuit includes a limiter stage which is biased to asymmetrically limit applied input signals in a manner that excursions in one polarity direction are of a duration substantially less than the duration of excursions in the opposite polarity direction, and further wherein excursions in said one polarity direction cause said transistor device to become less conductive.

2. A signal translating arrangement as defined in claim 1 wherein the duration of the excursions in said one polarity direction are of the order of the period of a wave of said ringing circuit.

3. A signal translating arrangement as defined in claim 2 wherein the quiescent direct current flow through said inductive element determines the amplitude of a wave of said ringing circuit.

4. A signal translating system comprising:

a current control device having input, output and common electrodes;

a signal input circuit;

a limiter stage coupling said signal input circuit between the input and common electrodes of said control device;

an energy storage circuit including reactive circuit elements tuned to a frequency higher than the range of desired signal frequencies applied to said input circuit; and means coupling said energy storage circuit between said output and common electrodes to produce output signal pulses at a repetition rate equal to an integral multiple, including one, of said input signal frequency; and wherein said limiter stage is biased to asymmetrically limit applied input signals in a manner that excursions in one polarity direction are of a duration substantially less than the duration of excursions in the opposite polarity direction, and further wherein excursions in said one polarity direction cause said current control device to become nonconductive to induce ringing in said reactive circuit elements.

5. A signal translating system comprising:

a current control device having input, output and common electrodes;

a signal input circuit;

a limiter stage coupling said signal input circuit between the input and common electrodes of said control device;

an energy storage circuit including reactive circuit elements tuned to a frequency higher than the range of desired signal frequencies supplied to said input circuit;

means coupling said energy storage circuit between said output and common electrodes to produce output pulses at a repetition rate equal to an integral multiple, including one, of said input signal frequency;

utilization means responsive to applied signals of a predetermined frequency; and means interconnecting said coupling means and said utilization means for deriving from said produced output pulses a signal component of fundamental frequency corresponding to said predetermined frequency and for applying said signal component to said utilization means to be operated thereupon.

6. A signal translating system comprising:

a junction transistor device having base, emitter and collector electrodes;

a signal input circuit coupled between said base and emitter electrodes;

a ringing circuit including an inductive element tuned to a frequency substantially higher than that of desired signals applied to said input circuit, said inductive element being coupled between said collector and emitter electrodes; and biasing means connected to said base, emitter and collector electrodes for establishing an operating point for said transistor such that said transistor responds to applied input signals to excite said ringing circuit and for damping out alternate half cycles of the resultant ringing wave of sufficient magnitude and polarity to forward bias the base-to-collector junction of said transistor.

7. A remote control system comprising:

first means for generating acoustic waves representative of control functions to be performed;

second means for detecting said acoustic waves and for converting said waves into electrical signals indicative thereof;

a control device having input, output and common electrodes;

third means for applying said electrical signals between the input and common electrodes of said control device;

an energy storage circuit including reactive circuit elements tuned to a frequency higher than the range of frequencies of desired signals applied by said third means;

fourth means for coupling said energy storage circuit between the output and common electrodes of said control device to produce output pulses at a repetition rate equal to an integral multiple, including one, of said applied signal frequency;

a plurality of tuned circuits;

and fifth means for coupling said output pulses to said plurality of tuned circuits to be selectively filtered thereby to develop function control signals for said remote control system.

References Cited

UNITED STATES PATENTS

| | | | |
|---|---|---|---|
| 2,467,777 | 4/1949 | Rajchman et al. | 328—28 X |
| 3,187,234 | 6/1965 | Muranaka et al. | 307—23 |

RODNEY D. BENNETT, *Primary Examiner.*

D. C. KAUFMAN, *Assistant Examiner.*

U.S. Cl. X.R.

340—171; 307—237, 261; 328—28